(12) United States Patent
Karg et al.

(10) Patent No.: US 8,279,665 B2
(45) Date of Patent: Oct. 2, 2012

(54) MEMORY CELL AND SELECT ELEMENT

(75) Inventors: Siegfried Friedrich Karg, Ruschlikon (CH); Gerhard Ingmar Meijer, Ruschlikon (CH)

(73) Assignee: International Business Machines Corporation, Armonk, NY (US)

( * ) Notice: Subject to any disclaimer, the term of this patent is extended or adjusted under 35 U.S.C. 154(b) by 132 days.

(21) Appl. No.: 12/949,047

(22) Filed: Nov. 18, 2010

(65) Prior Publication Data
US 2011/0120856 A1   May 26, 2011

(30) Foreign Application Priority Data

Nov. 23, 2009   (EP) ..................... 09176779

(51) Int. Cl.
*G11C 11/00* (2006.01)
(52) U.S. Cl. ............ 365/163; 365/174; 365/182
(58) Field of Classification Search ............ 365/163, 365/174, 182
See application file for complete search history.

(56) References Cited

U.S. PATENT DOCUMENTS

| | | | | |
|---|---|---|---|---|
| 6,815,286 B2 * | 11/2004 | Krieger et al. | ........... | 438/238 |
| 6,985,378 B2 * | 1/2006 | Kozicki | ........... | 365/153 |
| 7,142,450 B2 * | 11/2006 | Kozicki et al. | ........... | 365/174 |
| 7,199,444 B2 * | 4/2007 | Moore et al. | ........... | 257/529 |

* cited by examiner

*Primary Examiner* — Son Dinh
(74) *Attorney, Agent, or Firm* — Vazken Alexanian

(57) ABSTRACT

In accordance with an aspect of the present disclosure, a memory cell (1) or select element is provided. The element includes an ion conductor element (3) formed of a ion conductor material with mobile metal ions, a first electrically conducing electrode (4) in electrical contact with the ion conductor element, and a second electrically conducting electrode (6) in electrical contact with the ion conductor element, so that the memory cell or select element is programmable by applying an electrical voltage between the first electrode and the second electrode that causes the metal ions to be influenced so that an electrical resistance across the ion conductor element is caused to vary, for example because a metallic protrusion (7) is caused to grow or decompose. In contrast to prior art approaches, the ion conductor element has a shape that is asymmetrical with respect to an exchange of the first electrode (4) and the second electrode (6) for each other.

10 Claims, 2 Drawing Sheets

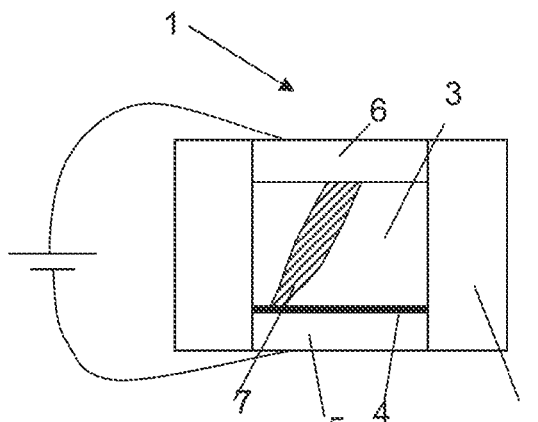
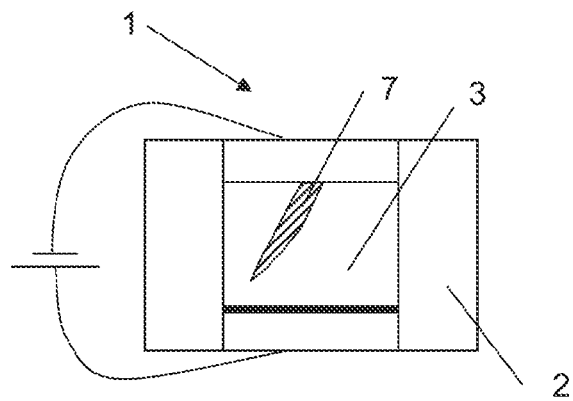
Fig. 1a  Fig. 1b
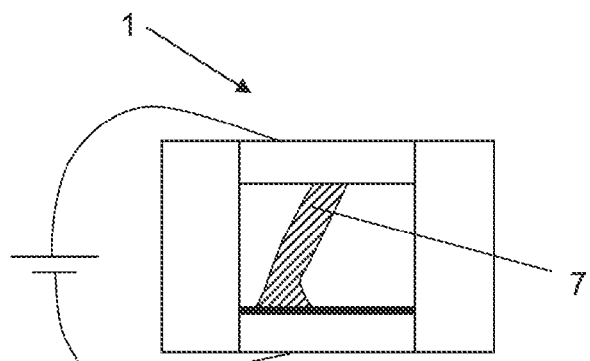
Fig. 1c
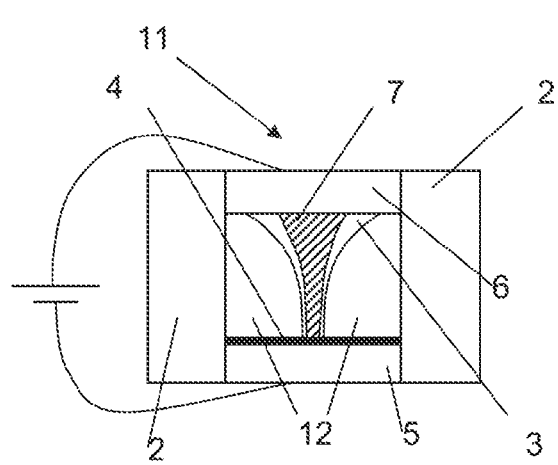
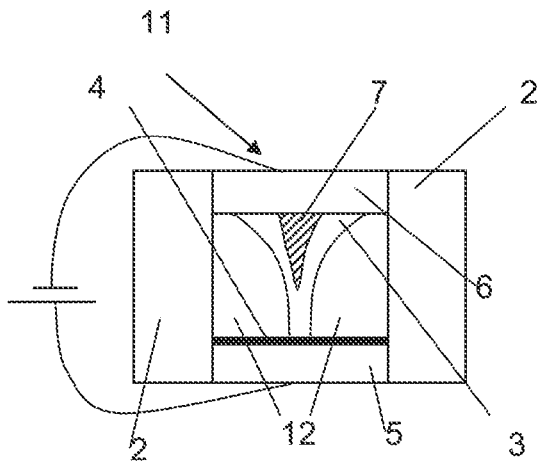
Fig. 2a  Fig. 2b

MEMORY CELL AND SELECT ELEMENT

CROSS REFERENCE TO RELATED APPLICATIONS

This application claims priority to EP application No. 09176779.8 filed on Nov. 23, 2009, the entire content of which is hereby incorporated herein by reference.

FIELD OF THE INVENTION

The present disclosure is in the field of memory devices and pertains to a memory cell or select element and to a memory device containing a plurality of such memory cells and/or select elements.

BACKGROUND OF THE INVENTION

Nonvolatile memory devices have been provided by the use of programmable-resistance materials based on mobile metal ions embedded in an electrolyte glass matrix. The according technology is known under the terms conductive-bridging RAM (CBRAM) or programmable metallization cell (PMC). Electrical pulses switch the resistance of these programmable-resistance materials reversibly and persistently between a low-resistance state and a high-resistance state. It is believed that this resistance switching is caused by electrochemical reduction and oxidation of the metal ions in the glass which leads to creation and annihilation of a metallic protrusion that forms a bridge between the two electrodes (some authors refer to this protrusion as "dendrite"; the teaching of the present text does not depend on a particular interpretation of the electrochemical processes or the shape of arising structures).

It has also been proposed to use programmable-resistance materials based on mobile metal ions embedded in an electrolyte glass matrix in select elements for nonvolatile memory cells. Select elements are required to make sure that during a read-, write- or erase-process of a certain memory element, memory cells of the same word or bit line do not interfere. The use of programmable-resistance materials for select elements has for example been proposed and described in U.S. Pat. No. 7,382,647.

Also in select elements, electrical pulses can switch the resistance of the programmable resistance material from a high-resistance state to a low-resistance state. In the select elements, the metallic protrusion that is believed to form, during application of a switching pulse, may according to a first option be annihilated after disconnecting the voltage supply due to diffusion, and the element returns to its high-resistance state, i.e. the select element is volatile. According to a second option, the metallic protrusion may, like in a memory cell, be annihilated by a voltage pulse of opposite polarity.

When used as a nonvolatile memory cell, these electrolyte elements have a large variation of the operating parameters, especially the resistance of the low-resistance state. The large variations of the properties of nominally identical programmable resistors used in the memory cells are severe drawbacks. Further drawbacks are the limited retention time, particularly at elevated temperatures, and the limited endurance.

Also when the electrolyte element is used as a select element, the limited endurance is a drawback. The failure mechanism is over-writing of the select element when writing the nonvolatile memory cell: To set, for example, phase-change RAM cells or also resistive memory cells to the low-resistance state, a long electrical pulse is required. By this, the metallic protrusion in the select element grows so extensively that it cannot be annihilated anymore.

SUMMARY

In accordance with one embodiment of the present disclosure, a memory cell or select element is provided. The element comprises an ion conductor element formed of a ion conductor material with mobile metal ions, a first electrically conducing electrode in electrical contact with the ion conductor element, and a second electrically conducting electrode in electrical contact with the ion conductor element, so that the memory cell or select element is programmable by applying an electrical voltage between the first electrode and the second electrode that causes the metal ions to be influenced so that an electrical resistance across the ion conductor element is caused to vary, for example because a metallic protrusion is caused to grow or decompose. The ion conductor element has a shape that is asymmetrical with respect to an exchange of the first electrode and the second electrode for each other. In other words, the ion conductor element has a shape that is asymmetrical with respect to an exchange of the positions of the first electrode and the second electrode for each other.

By this, the ion conductor element may be designed so as to influence and direct the shape and orientation of the conducting bridge between the electrodes that arises due to the programming voltage pulse. Especially, the first electrode may comprise the chemical element of the mobile metal ions (the electrode thus functioning, in part, as sacrificial electrode), and the ion conductor element may have a shape that tapers/narrows towards the first electrode, so that any conducting bridge is confined towards the first electrode. The electrically active region is thus determined by a well-defined shape.

In other words, the asymmetry may allow having a comparably large second interface area between the electrolyte and the second electrode from which the metallic protrusion starts growing. However, the electrolyte may have a small first interface area to the first electrode, so that the contact point between an arising conducting bridge and the first electrode is rather precisely defined, and over-writing (i.e. a too large contact area between the conducting bridge and the first electrode) may be prevented.

The ratio between the second and the first interface areas may be at least 3, preferably at least 10.

In other embodiments of the present disclosure, the memory cell or select element is formed as a layered system on a basic area that is lithographically or sub-lithographically defined on a substrate. In an ion conductor layer within the basic area, the memory cell or select element comprises an electrically active region of the ion conductor material and an electrically inactive region constituted by electrically insulating material. The electrically active and inactive regions may be patterned lithographically and/or by a method of patterning sub-lithographically. For example, the memory cell may be provided in a through-like structure in a dielectric or semiconducting substrate. The memory cell may comprise, as subsequent layers or layer systems, the first electrode, the ion conductor layer, and the second electrode, wherein the ion conductor layer comprises lateral electrically insulating portions and a central ion conductor portion, the electrically insulating portions and the ion conductor portions being structured vertically, i.e. it is not symmetrical with respect to a central horizontal plane. More concretely, the ion conductor portion may widen towards the second electrode and may narrow towards the first electrode.

The approach according to some embodiments of the present disclosure may allow to define the electrically active region—and thus the possible shape of an electrically conducting bridge—by well-defined processing parameters. Moreover, electrically active and inactive regions can be made of different, individually optimized materials. The memory cell or select element moreover may provide a significant variability due to a reduced statistical spread of the operating parameters. This is because the geometrical path dimensions and the possible contact area between a conducting bridge and the electrodes may be influenced or even determined by well defined fabrication parameters: the resistance of the low-resistance state is better defined through a directioning of the conducting bridge to the narrow portion towards the first electrode—which may for example be in the center of the first electrode. Moreover, the retention time can be improved due to inhibited diffusion of ions between the electrical active and inactive region. In addition, the endurance may be increased because a major failure mechanism may be eliminated: over-writing may be inhibited because of a limited contact area between the ion conductor portion and the first electrode.

Embodiments of the present disclosure may provide reduced cross-talk between neighboring memory cells if the ion conductor portions of neighboring cells are essentially identical. Because, as mentioned, the contact point between the conducting bridge and the first electrode is precisely defined, it can be avoided that the conducting bridges of two neighboring memory cells come close to each other. The spacing between the conducting bridges of neighboring cells may thus always correspond to the pitch.

The memory cell or select element may be preferably, as mentioned, in a vertical configuration, in which the first and second electrodes are different layers (or parts thereof) of a layer system on a substrate. Such a vertical configuration is more space-saving than horizontal configurations. In such a vertical configuration, the ion conductor element has in-plane dimensions that vary as a function of the vertical position, i.e. the area of the ion conductor element in horizontal section increases as a function of the distance to the first electrode. Electrically insulating spacer elements may be used to manufacture such a memory cell or select element. For example, structures of the kind of "sidewall spacers" of MOSFETs, which have a curved surface, may be grown firstly on the first electrode, and then the remaining space is filled by the electrolyte material of the ion conductor element.

The electrolyte material for the ion conductor element may for example be germanium selenide ($Ge_xSe_{1-x}$), germanium sulfide ($Ge_xS_{1-x}$), germanium telluride ($Ge_xTe_{1-x}$), silicon sulfide ($Si_xS_{1-x}$), silicon selenide ($Si_xSe_{1-x}$), silicon telluride ($Si_xTe_{1-x}$), arsenic sulfide ($As_xS_{1-x}$), arsenic selenide ($As_xSe_{1-x}$), arsenic telluride ($As_xTe_{1-x}$), lead sulfide ($Pb_xS_{1-x}$), lead selenide ($Pb_xSe_{1-x}$), lead telluride ($Pb_xTe_{1-x}$), cadmium sulfide ($Cd_xS_{1-x}$), cadmium selenide ($Cd_xSe_{1-x}$), cadmium telluride ($Cd_xTe_{1-x}$), zinc sulfide ($Zn_xS_{1-x}$), zinc selenide ($Zn_xSe_{1-x}$), zinc telluride ($Zn_xTe_{1-x}$), silver sulfide ($Ag_xS$), silver selenide ($Ag_xSe$), copper sulfide ($Cu_xS$), copper selenide ($Cu_xSe$), tungsten oxide ($WO_x$), copper oxide ($Cu_xO$), or any other electrolyte material, especially electrolyte glass material that is suitable. The ions may be one or more of silver ions, copper ions, lithium ions, sodium ions zinc ions, aluminium ions, and tungsten ions. The first electrode material may be of the chemical element(s) of the ions or may be of an alloy that comprises the chemical element(s). Electrolyte/ion combinations with a high diffusion constant (such as silver ions in $Ge_xSe_{1-x}$) are especially suitable as select elements, whereas combinations with a low diffusion constant—such as combinations with Al ions—are especially suited as memory cells.

A memory device according to embodiments of the present disclosure may, in accordance with a first option, comprise a plurality of memory cells of the above-described kind. The memory device will further comprise contacting means as such known in the art for individually contacting the memory cells for read and write (and possibly erase) processes; examples include architectures with vertically oriented contacting lines ("word lines" and "bit lines") for arrays of memory cells.

In accordance with a second option, a memory device according to embodiments of the present disclosure may comprise memory cells of any kind (for example phase-change RAM cells or also resistive memory cells) in which the switching states are distinguished by their electrical resistance, and may comprise, per memory cell, a select element in accordance with the above teaching.

BRIEF DESCRIPTION OF THE DRAWINGS

In the following, embodiments of the present disclosure will be described referring to accompanying drawings. The drawings are all schematic and not to scale. In the drawings, same reference numerals refer to same or corresponding elements.

FIGS. 1a and 1b depict, in a transversal section, a prior art memory cell or select element in two programming states;

FIG. 1c shows the memory cell or select element of FIGS. 1a and 1b in an "overwrite" state;

FIGS. 2a and 2b depict, in transversal section, a memory cell according to the invention in two programming states;

DESCRIPTION OF THE PREFERRED EMBODIMENTS

Figure 3:
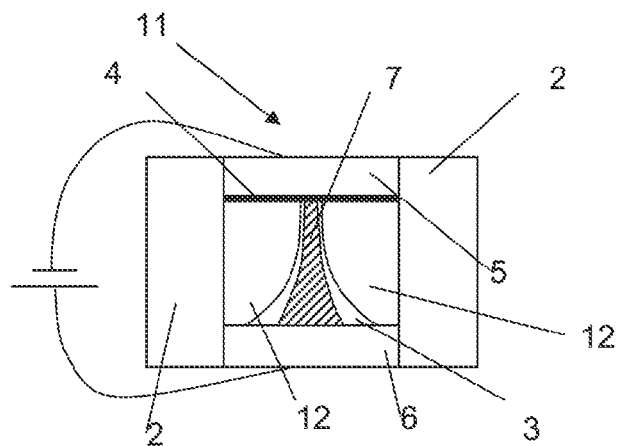
FIG. 3 shows a variant of the memory cell in the first programming state.

The memory cell 1 as depicted in FIGS. 1a and 1b comprises, on a substrate and embedded in a dielectric 2, a layered system of a metal layer 5, a first electrode 4, an electrolyte 3, and a second electrode 6. The first electrode is of an electrochemically active metal, i.e. of a metal that tends to release cations into the electrolyte material. If a negative voltage pulse is applied to the second electrode 6 with respect to the first electrode, a metallic protrusion 7 tends to form an electrically conducting bridge between the first and the second electrode (FIG. 1a). The conducting bridge starts growing from the second electrode, by which the cations present in the electrolyte are attracted, and closes at the second electrode. The memory cell then is in the first, conducting switching state. Upon application of a positive voltage pulse to the second electrode 6 (reverse bias), the metallic protrusion 7 will withdraw (FIG. 1b), opening first at the first electrode (4). As a consequence, the memory cell will be in the second, insulating switching state.

A problem arising in these memory cells 1 is that the protrusion is only weakly controlled. It can have various shapes, and the point of contact with the first electrode 4 is not predictable. Also, 'overwriting' may occur, i.e. the conducting bridge may contact the electrode so extensively, that it is not possible any more to annihilate the protrusion by applying a pulse in the other direction (or by diffusion, which would be a possibility if the depicted element would be a select element instead of a memory cell). The 'overwrite' state is schematically depicted in FIG. 1c.

In embodiments of the invention, in contrast, the electrically active region of a programmable-resistance material of an electrolyte material with embedded mobile ions is formed in a controlled manner, for example using lithographic means.

An embodiment of such a memory cell 11 is depicted in FIGS. 2a and 2b. FIG. 2a shows the memory cell 11 in the conducting state, and FIG. 2b depicts it in the non-conducting state.

The substrate (not shown) may be of any suitable substrate material, such as silicon or another semiconductor material, glass or any other suitable substrate material. An inter-layer dielectric (ILD) such as a flouorosilicate glass (FSG) layer 2 (or for example a boronphosphorosilicate (BPSG) glass or $SiO_2$ layer or layer of any other suitable insulating material) is grown on the substrate, and by lithographic means a gap is for the memory cell is made in the FSG layer. The gap defines the basis area. In the gap, a layered system of the metal layer 5 (for example a copper layer) the first electrode 4, an ion conductor layer and the second electrode 6 is grown. The first electrode 4 is of an electrochemically active metal, such as silver. The second electrode is of an electrochemically non-active metal, such as platinum.

The ion conductor layer comprises an electrically active portion 3 that comprises the electrolyte (for example GeSe with embedded Ag ions) and in which the metallic protrusion 7 may grow or be annihilated. It further comprises an electrically inactive, dielectric portions 12, for example of $SiO_2$ or of $Si_3N_4$. The electrically active portion 3 is structured to taper towards the first electrode 4 so that the area of contact to the first electrode is small (especially, the area of contact significantly smaller than the area of contact with the second electrode 6), and as a consequence the possible point of contact of the metallic bridge to the first electrode is defined within narrow limits.

The layered system as depicted may be fabricated as follows: in the gap, the metal layer 5 and the first electrode layer 4 are deposited in a well-known manner. Then, the dielectric portions 12 are formed, for example by a technique known for making so-called "sidewall spacers" of MOSFETs. Such a known technique may for example include a Chemical Vapor Deposition (CVD) step followed by an anisotropic ion etching (RIE) step. Then, the resulting gap between the dielectric portions is filled by the electrolyte material, and its upper side is prepared by chemical mechanical polishing (CMP). Finally, the second electrode 6 is added on top of the polished upper side of the electrolyte.

The metal layer 5 has the purpose to support and contact the first electrode 4. It is optional, i.e. instead of the metal layer 5 the first electrode may have an accordingly extended shape.

Preferably, the sidewall-spacer-like dielectric portions 12 are formed from all four sides of the through formed by the gap in the ILD layer 2, thus the in-plane extension of the electrically active portion 3 is constricted with respect to two dimensions towards the first electrode 4.

Depending on the applied technique, also an upside-down (compared to the above-described first embodiment) configuration may be possible, as is illustrated in FIG. 3. For this, after deposition of the second electrode 6, the electrically active portion 3 is deposited in a manner that it narrows or even points towards the upper side. Then, the resulting structure is covered by the electrically inactive portions 12. After a further polishing (CMP) step, the first electrode 4 and the metal layer 5 are added.

Figure 4A:
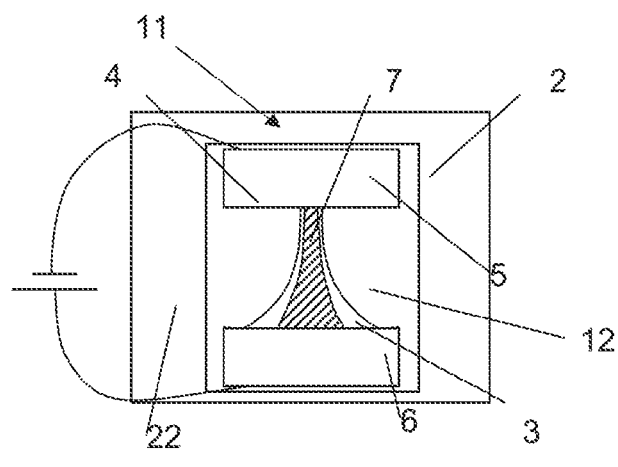
FIGS. 4a and 4b show an embodiment in a horizontal configuration.
Figure 4B:
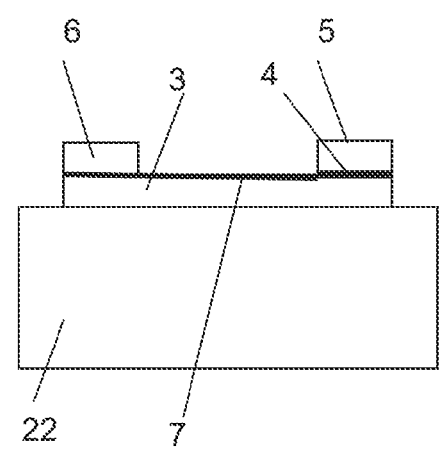

FIGS. 4a and 4b yet depict an embodiment of a memory cell that is based on a horizontal configuration. FIG. 4a shows a plan view of the memory cell, whereas FIG. 4b shows a longitudinal section. On the substrate 22, which may be of glass or of any other suitable substrate material, a layered structure comprising the electrolyte 3 is grown. On top of the electrolyte 3 and at opposed positions the first electrode 4 and the second electrode 6 are grown. Again, in addition to the second electrode a metal portion 5 is provided. The electrolyte 3 is sub-lithographically structured to be tapered towards the first electrode. The structure may optionally comprise electrically inactive material 12 adjacent the electrolyte.

The metallic protrusion 7 may be expected to grow along the upper surface of the electrolyte, nourished by the first electrode 4.

Whereas the hereinbefore described embodiments are referred to as "memory cells" the same geometries, materials and principles apply to select elements as well. For select elements, in contrast to the memory cells also electrolyte materials with high thermally induced ion diffusion are suitable for the electrolyte, in addition to the materials with low thermally induced ion diffusion.

Any disclosed embodiment may be combined with one or several of the other embodiments shown and/or described. This is also possible for one or more features of the embodiments.

The terms "certain embodiments", "an embodiment", "embodiment", "embodiments", "the embodiment", "the embodiments", "one or more embodiments", "some embodiments", and "one embodiment" mean one or more (but not all) embodiments unless expressly specified otherwise. The terms "including", "comprising", "having" and variations thereof mean "including but not limited to", unless expressly specified otherwise. The enumerated listing of items does not imply that any or all of the items are mutually exclusive, unless expressly specified otherwise. The terms "a", "an" and "the" mean "one or more", unless expressly specified otherwise.

Devices that are in communication with each other need not be in continuous communication with each other, unless expressly specified otherwise. In addition, devices that are in communication with each other may communicate directly or indirectly through one or more intermediaries. Additionally, a description of an embodiment with several components in communication with each other does not imply that all such components are required. On the contrary a variety of optional components are described to illustrate the wide variety of possible embodiments. Further, although process steps, method steps, algorithms or the like may be described in a sequential order, such processes, methods and algorithms may be configured to work in alternate orders. In other words, any sequence or order of steps that may be described does not necessarily indicate a requirement that the steps be performed in that order. The steps of processes described herein may be performed in any order practical. Further, some steps may be performed simultaneously, in parallel, or concurrently.

When a single device or article is described herein, it will be apparent that more than one device/article (whether or not they cooperate) may be used in place of a single device/article. Similarly, where more than one device or article is described herein (whether or not they cooperate), it will be apparent that a single device/article may be used in place of the more than one device or article. The functionality and/or the features of a device may be alternatively embodied by one or more other devices which are not explicitly described as having such functionality/features. Thus, other embodiments need not include the device itself.

What is claimed is:

1. A memory cell or select element, comprising an ion conductor element formed of a ion conductor material that comprises mobile metal ions, and further comprising a first electrically conducing electrode in electrical contact with the ion conductor element, and a second electrically conducting electrode in electrical contact with the ion conductor element, whereby the memory cell or select element is programmable by applying an electrical voltage between the first electrode and the second electrode that causes the metal ions to be influenced so that an electrical resistance across the ion conductor element is caused to depend on a polarity of the applied voltage, wherein the ion conductor element has a shape that is asymmetrical with respect to an exchange of the first electrode and the second electrode for each other.

2. The memory cell or select element according to claim 1, wherein the metal ions comprise ions of a first metallic chemical element and that the first electrode comprises the first metallic chemical element.

3. The memory cell or select element according to claim 2, wherein an area of a first interface between the first electrode and the ion conductor element is smaller than an area of a second interface between the second electrode and the ion conductor element.

4. The memory cell or select element according to claim 3, wherein the area of the first interface is smaller than the area of the second interface by at least a factor 3, preferably at least by a factor 10.

5. The memory cell or select element according to claim 1, wherein the ion conductor element tapers towards the first electrode.

6. The memory cell or select element according to claim 1, further comprising a layered arrangement on a substrate, the first electrode, the ion conductor element and the second electrode forming different layers or layer systems.

7. The memory cell or select element according to claim 6, wherein an area of the ion conductor element in a horizontal section increases as a function of a distance to the first electrode.

8. The memory cell or select element according to claim 6, comprising electrically insulating spacer elements in the layer of the ion conductor element, the spacer elements tapering towards the second electrode.

9. The memory cell or select element according to claim 7, comprising an interface between the spacer elements (12) and the ion conductor element (3) that is curved.

10. A memory device comprising: a plurality of memory cells or select elements comprising an ion conductor element formed of a ion conductor material that comprises mobile metal ions, and further comprising a first electrically conducing electrode in electrical contact with the ion conductor element, and a second electrically conducting electrode in electrical contact with the ion conductor element, whereby the memory cell or select element is programmable by applying an electrical voltage between the first electrode and the second electrode that causes the metal ions to be influenced so that an electrical resistance across the ion conductor element is caused to depend on a polarity of the applied voltage, wherein the ion conductor element has a shape that is asymmetrical with respect to an exchange of the first electrode and the second electrode for each other, the memory device further comprising contacts for applying electrical signals individually between the electrode and for reading out by determining an electrical resistance across the memory cells or select elements.

\* \* \* \* \*